(12) United States Patent
Ohlig

(10) Patent No.: US 6,268,920 B1
(45) Date of Patent: Jul. 31, 2001

(54) REGISTRATION OF SHEET MATERIALS USING STATISTICAL TARGETS AND METHOD

(75) Inventor: Albert H. Ohlig, Newport Beach, CA (US)

(73) Assignee: OLEC Corporation, Irvine, CA (US)

( * ) Notice: Subject to any disclaimer, the term of this patent is extended or adjusted under 35 U.S.C. 154(b) by 0 days.

(21) Appl. No.: 09/267,094

(22) Filed: Mar. 11, 1999

(51) Int. Cl.[7] .................................................. G01B 11/00
(52) U.S. Cl. ............................................ 356/401; 356/399
(58) Field of Search ................................... 356/399, 401, 356/400

(56) References Cited

U.S. PATENT DOCUMENTS 5,170,058 * 12/1992 Berasi et al. ...................... 250/548
5,643,699    7/1997 Waldner .

* cited by examiner

Primary Examiner—Robert Kim
Assistant Examiner—Andrew H. Lee
(74) Attorney, Agent, or Firm—Fenwick & West, LLP

(57) ABSTRACT

Method and apparatus operates on recognizable target images disposed on upper and lower layers of master photographic images, and on apertures formed in an intermediate layer to resolve positional misalignments and requisite correctional movements of the layers to align upper and lower layers with the intermediate layer within tolerances that are improved by multiple samples of position data pertaining to the apertures formed in the intermediate layer. Inspection cameras produce output data signals representative of target images and aperture patterns detected by inspection cameras that are positioned to establish fields of view encompassing aperture patterns on an intermediate layer and distinguishable target images on upper and lower layers. A computer responsive to the output data signals from the inspection cameras segregate the recognizable target images and aperture patterns and produce output control signals to mechanical translators coupled to the intermediate panel and to one of the upper and lower layers for selectively positioning the movable layers along orthogonal and skew axes to align the positions of the three layers with improved accuracy.

7 Claims, 9 Drawing Sheets

Drill Path

REGISTRATION OF SHEET MATERIALS USING STATISTICAL TARGETS AND METHOD

RELATED APPLICATIONS

The subject matter of this application is related to the subject matter of pending application Ser. No. 09/108,056 filed on Jun. 26, 1998, which is a continuation of application Ser. No. 08/814,023 filed on Mar. 10, 1997, the subject matter of which applications is incorporated herein by this reference.

FIELD OF THE INVENTION

This invention relates to registration techniques for aligning master art work films or sheets with substrates for forming printed circuit wiring on rigid or flexible printed circuit panels, and more particularly to apparatus and method for aligning art work and substrate with enhanced precision.

BACKGROUND OF THE INVENTION

Consumer demands for smaller products, at lower cost with faster operation and more features, are placing demands on the size and density of printed circuits. One of the most challenging tasks for the manufacturer of circuit boards is to form electrical connections to contact a series of drilled or individually punched holes.

Mechanically formed holes contribute large-tolerance errors to the precision of the overall circuit board, which reduces the potential for increased wiring density. In addition, the production costs of circuit boards are also affected by the use of finer drills which provide more room for circuitry but have shorter lives, and tend to wander. A costly by-product of alignment tolerance is the requirement for drilling smaller stacks of boards on the drilling machine as a result of drill wander. Drilling is already a slow and costly operation, and restriction to drilling fewer circuit boards simultaneously contributes additional costs and production delays.

A common practice for registration on existing machines is to use two CCD cameras to align the circuit board panel with master image films by observing two drilled holes across the width of the circuit board panel. As illustrated in FIG. 1, a typical circuit board panel includes two holes spaced apart along a horizontal, or X axis, for use in alignment. The registration of the circuit board panel to a master film is typically done with a dot on the film to be centered within the perimeter of a hole in the circuit board panel, as illustrated in FIG. 2.

In these conventional schemes, it can be assumed that drilling tolerance is of the order of +/−20 microns, although, depending upon number of factors, mechanical drilling may only be accomplished within a tolerance of +/−75 microns, with predominantly random factors contributing to positional errors. FIG. 3 displays a 100-hole Gaussian simulation of errors encountered in the hole location in one axis, as simulated using a random number generator. The distribution probability of the error of the ultimate hole location along a given axis is displayed in the form of a bell curve, as illustrated in FIG. 4. In the X-axis direction, the hole locations are averaged over the two spaced holes, with resultant registration as illustrated in FIG. 5.

When these hole locations are used to position a circuit board panel relative to an image on a master film, the drill error is reflected in misalignment of panel and film. In addition, there is a high probability that the two positioning holes in the circuit board panel will typically and frequently occupy positions with errors that are displaced in opposite directions from one another. This induces a rotational error in the panel that can increase the positional error over the drilling error, for example, by 12% on a 610×710 mm panel, as illustrated in FIG. 6.

Alternative conventional schemes use four targets to position the panel relative to the master film, as illustrated in FIG. 7, by using moving cameras or multiple cameras. This provides the stability of a two-point sample in both X and Y axes and reduces the rotational error, but increases cost and reduces production rate.

SUMMARY OF THE INVENTION

In accordance with one embodiment of the present invention, optical targets improve registration accuracy when aligning master film images to holes in circuit board panels that are generated in accordance with the invention. One application registers the master film images to drilled holes near the outer perimeter of a printed circuit board. Accuracy of registration is based upon the impact of sample size when characterizing position data that has a random component. The position of an individual point is subject to the full error tolerance. In accordance with one embodiment of the present invention, additional samples are collected to increase the accuracy of the calculated location of the centroid or middle point of the position samples.

DESCRIPTION OF THE INVENTION

Figure 1:
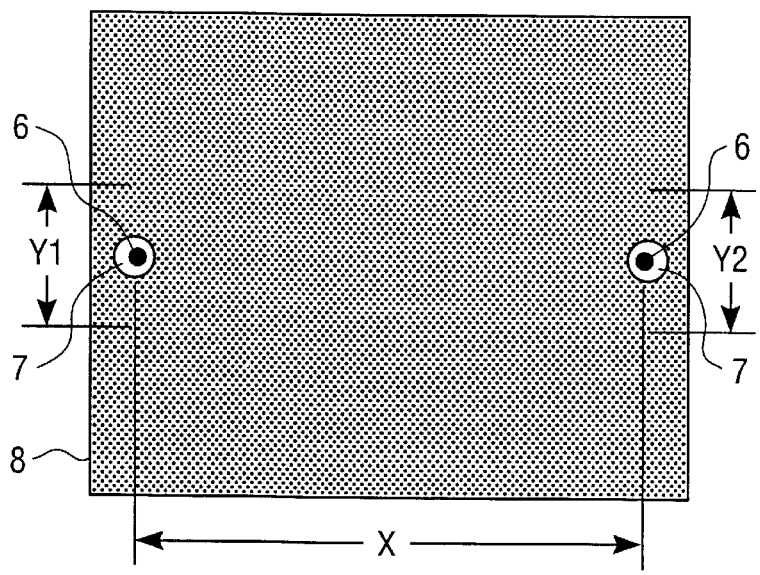
FIG. 1 is a plan view of a typical circuit board panel 8 with registration holes 7 oriented relative to targets 6 on a master image film.
Figure 2:
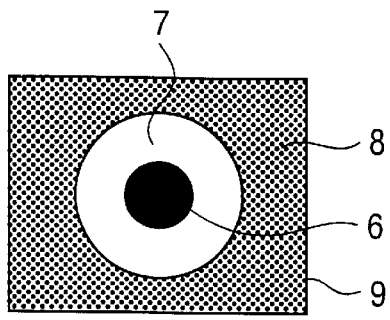
FIG. 2 is a close-up plan view of a target 6 on a master-image film oriented relative to the perimeter of a registration hole 7 in a circuit board panel 8 within the field of view 9 of an inspection camera.
Figure 3:
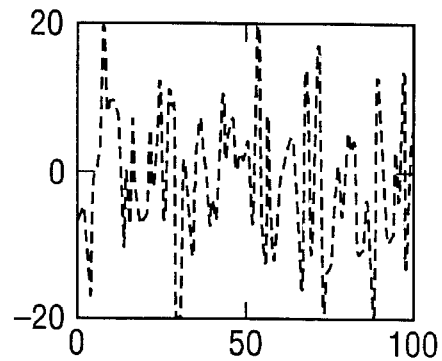
FIG. 3 is a chart showing a simulation of typical errors in locating mechanically-formed holes in circuit board panels.
Figure 4:
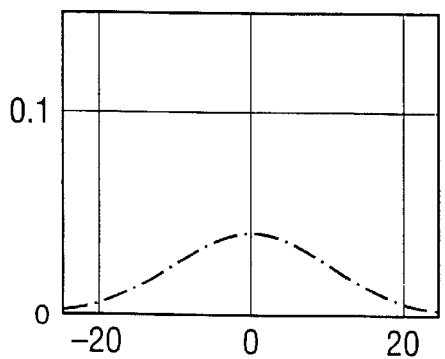
FIG. 4 is a graph showing the distribution of errors along a vertical axis in locating mechanically-formed registration holes in circuit board panels according to FIG. 1.
Figure 5:
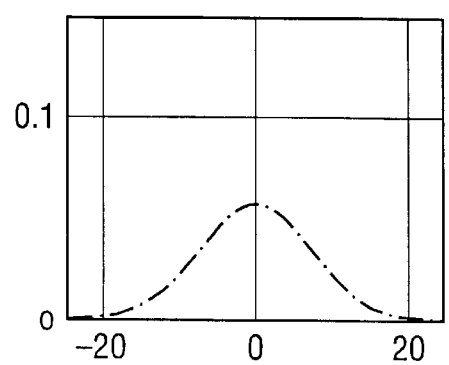
FIG. 5 is a chart showing the distribution of errors along the horizontal axis in locating mechanically-formed registration holes formed in pairs on circuit board panels according to FIG. 1.
Figures 6, 7:
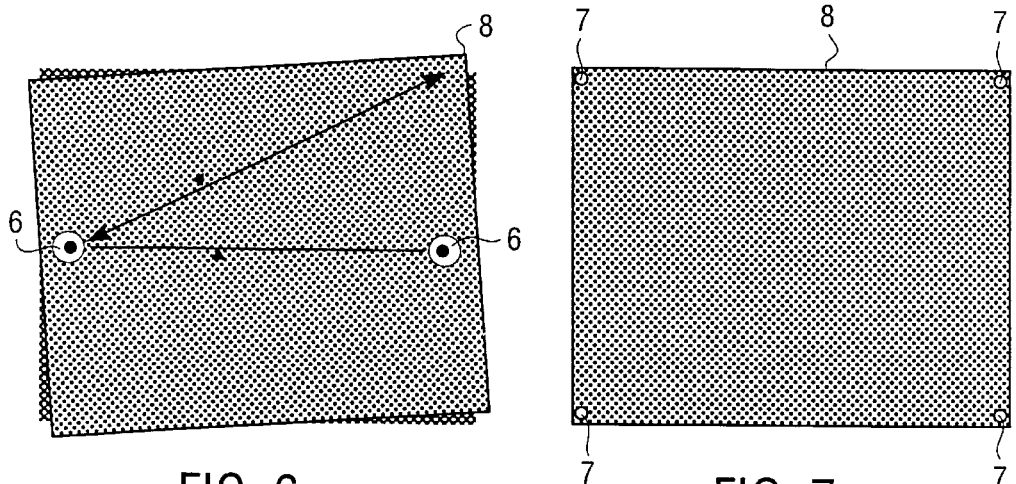
FIG. 6 is a plan view of a circuit board panel 8 and target 6 on master-image film shown in rotational misalignment.
FIG. 7 is an alternative embodiment of a circuit board panel 8 including multiple registration holes 7 about the periphery.
Figure 8:
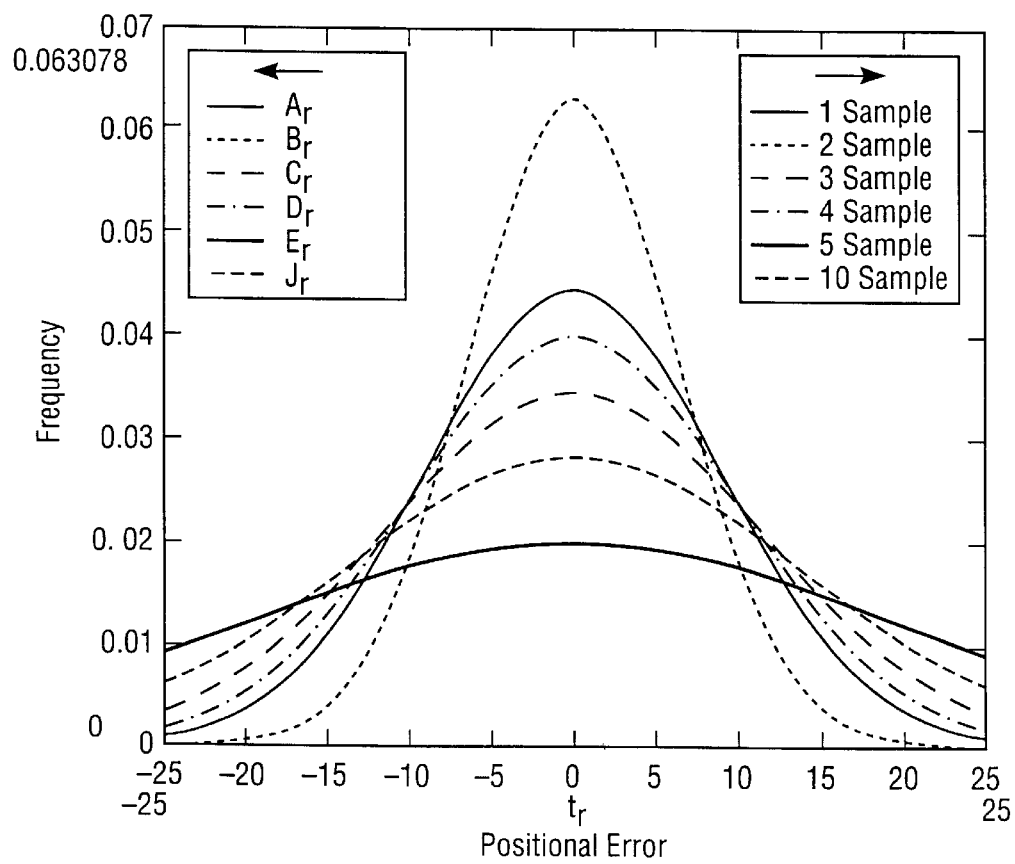
FIG. 8 is a graph showing a family of bell-shaped curves representing reductions in probability of misalignment errors attributable to multiple samples of registration data.

Referring now to the graph of FIG. 8, there is shown improved accuracy of registration along a given axis derived from 'averaging' multiple samples of registration holes having random error components. Specifically, it should be noted that the frequency of occurrence of correct positional orientation increases with number of samples of registration holes so 'averaged', as later discussed herein. It should be noted that conventional image processing apparatus commercially available, for example, from Matrox or Cognex, or the like, is commonly associated with a library of recognizable images such as line or cross-hair or dot-in-circle images to be recognized and processed.

Figure 9:
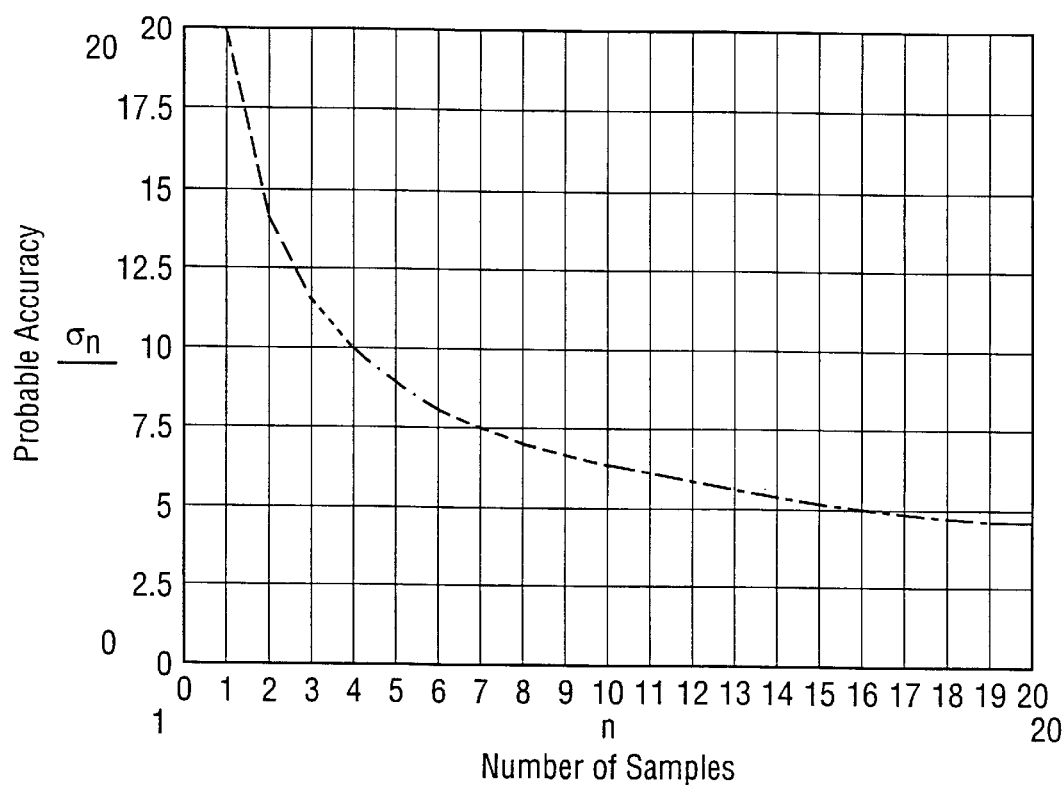
FIG. 9 is a graph illustrating probable accuracy improvements attributable to multiple samples of position data.
Figure 10:
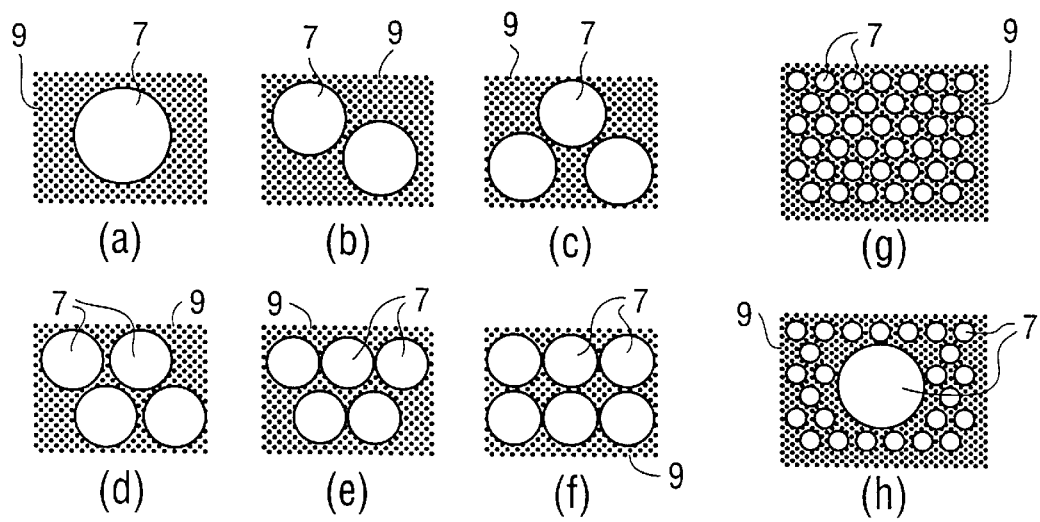
FIGS. 10a–h are illustrative alternative embodiments of patterns of multiple registration holes 7 in circuit board panels within the field of view 9 of an inspection camera, according to the present invention.

In accordance with the present invention, increased sample data regarding hole positions promotes increased accuracy, as illustrated in the graph of FIG. 9, and such increased samples data may be provided according to the embodiments illustrated in FIGS. 10b–h by forming multiple registration holes 7 within the field of view 9 of an inspection camera. Multiple holes 7 formed at predetermined coordinates (with probable random positional error in each hole) within the field of view 9 on circuit board panels 8 thus yield multiple samples of positional data for enhanced accuracy of the computed orientation or position of the circuit board panel 8, and may be recognized as an image within a library of images associated with image-processing apparatus, as later described herein. A progression in the number of drill holes 7 formed in a circuit board panel within the field of view 9 of an inspection camera (such as a conventional Charge-Coupled Digitizing camera) is illustrated in FIGS. 10a–f, and examples of patterns of very many holes, and of many holes of different sizes are illustrated in FIGS. 10g, h, as representative embodiments of targets that yield multiple samples of registration data within the field of view of an inspection camera.

Benefits derived from multiple registration holes per each field of view 9 inspected on a circuit board panel 8 include the increased sample data and associated positional accuracy of the panel 8 that can be computed therefrom, as well as expanded range of misalignments that can be captured and brought into dynamic correction according to the present invention, as described in greater detail below. In addition, information may be collected regarding the positional variations that occur with specific drills and drill sizes for determining mechanical positioning errors and drill wander. It must be noted, however, that each hole 7 to be formed as part of a registration pattern includes associated costs and production delays that will be determinative of the pattern of holes best suited for the accuracy, costs and delays incurred for particular circuit board applications. And, such patterns of multiple holes should ideally include unique incremental characteristic patterns to avoid positioning redundancy that might be associated with an iterative hole pattern that repeats one or more times per unit length along a positioning axis.

Figure 11:
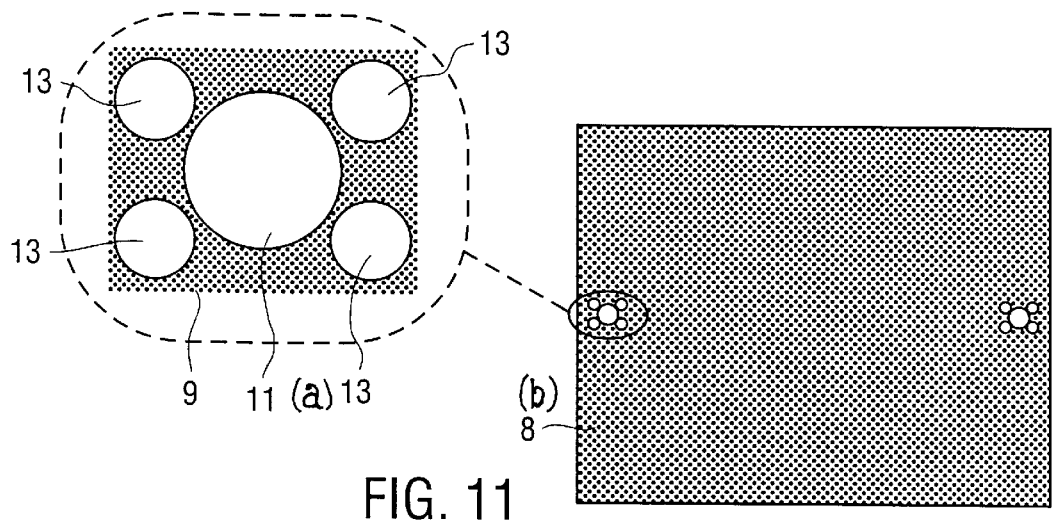
FIGS. 11(a) and (b) comprise a plan view of a pattern of registration holes 7 in a circuit board panel 8 according to one embodiment of the present invention.
Figure 12:
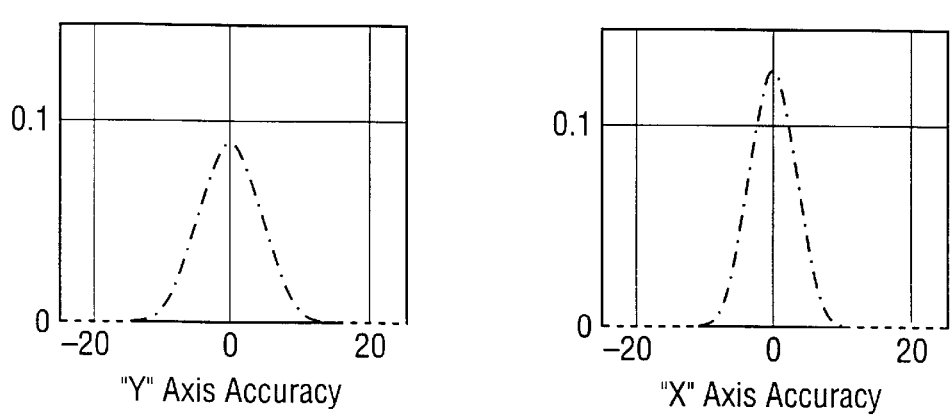
FIGS. 12a, b are graphs showing distribution of errors along, respectively, vertical and horizontal axes in locating mechanically-formed registration holes in circuit board panels according to FIGS. 11(a) and (b)

In accordance with the illustrated embodiment of the present invention in FIGS. 11(a) and (b), each field of view 9 of an inspection camera relative to a circuit board panel 8 includes one central large hole 11 and four additional smaller holes 13 oriented about the periphery of the large central hole 11 within the corner regions of the field of view 9. One benefit of such configuration of holes is that greater search and capture range is possible on the basis of the central large holes 11, as later described herein, while the four additional smaller holes 13 increase sample data regarding the mechanical position accuracy of the drill. Thus, two spaced-apart target patterns on a circuit board 8, as shown in FIGS. 11(a) and (b), promote enhanced positioned accuracy of the circuit board panel 8 along 'X' and 'Y' axes, as illustrated in the graphs of FIGS. 12a, b. The fields of view and the holes drilled through panels 8 within such fields of view may be substantially aligned at maximally-spaced locations along the central X-axis of the panel 8.

For accurate registration of master images on film with respect to the position of a circuit board panel 8, the relative positioning of two such sheets, or film and panel, must also be considered. A CCD-type of inspection camera and associated conventional image processing equipment can identify registration holes 11, 13 in a circuit board panel 8 and can also identify reference marks 6, 12, 14 on master-image films. One technique relies upon locating a target spot 6 within a circle, and may rely upon identifying pixels in a region with similar brightness, and then averaging the brightness values of such similar pixels. Where the target spot 6 has significant area within a target circle, for example, the inner region of the target spot can be identified and segregated from calculation of the larger circular region. A geometric pattern such as a spot of selected diameter, or lines at angular intersection stored in computer memory can be recognized within the field of view 9 of an inspection camera for such selective computations.

Larger samplings of numbers of holes within a field of view 9 on a circuit board panel 8 can be identified by pixel locations, and additionally, some or all of such holes may have recognizable reference marks on master films in rough alignment therewith to facilitate establishing a relative location of the circuit board panel and alignment therewith of a master-image film.

Referring then to FIGS. 13*a–d*, there are shown various combinations of registration hole-patterns and marks on one or more master films for assembly and alignment within fields of view 9 of an inspection camera, or cameras. For a pattern of 5 holes within the field of view 9, a larger central hole 11 may be used for panel alignment as well as for panel location or position searching. An image processor operating on output signals from a CCD camera can readily identify a circular hole of the correct dimensions, and can readily locate horizontal 12 and vertical lines or diagonal lines 14 in cross-wise orientation. This information can be used to align a circuit board panel and upper and lower master films, by controlling independent actuators therefor, to produce composite targets within a field of view 9, as illustrated in FIG. 13*d*. The four additional holes 13 provide increased statistical sample data about the position of the panel 8, and round target images 6, for example, on the lower master film and viewable within such multiple drill holes 13 may facilitate computed correlation with known target patterns for enhanced positional accuracy of the circuit board panel 8 with respect to the lower master film as a positioning reference. Similarly, diagonal cross lines 14 at predetermined coordinates on the upper master film (and optionally a set of perhaps 2 spot targets 6 viewable within diagonal ones of the smaller holes 13 if not carried on the lower master film) may facilitate computed correlation with known target patterns for enhanced positional accuracy of the circuit board panel 8 with respect to lower master film as a positioning reference. The lower master image film as a positioning reference does not suffer statistical variations in positional accuracy of the target images, as occur in drill holes through the panel 8.

Figure 14:
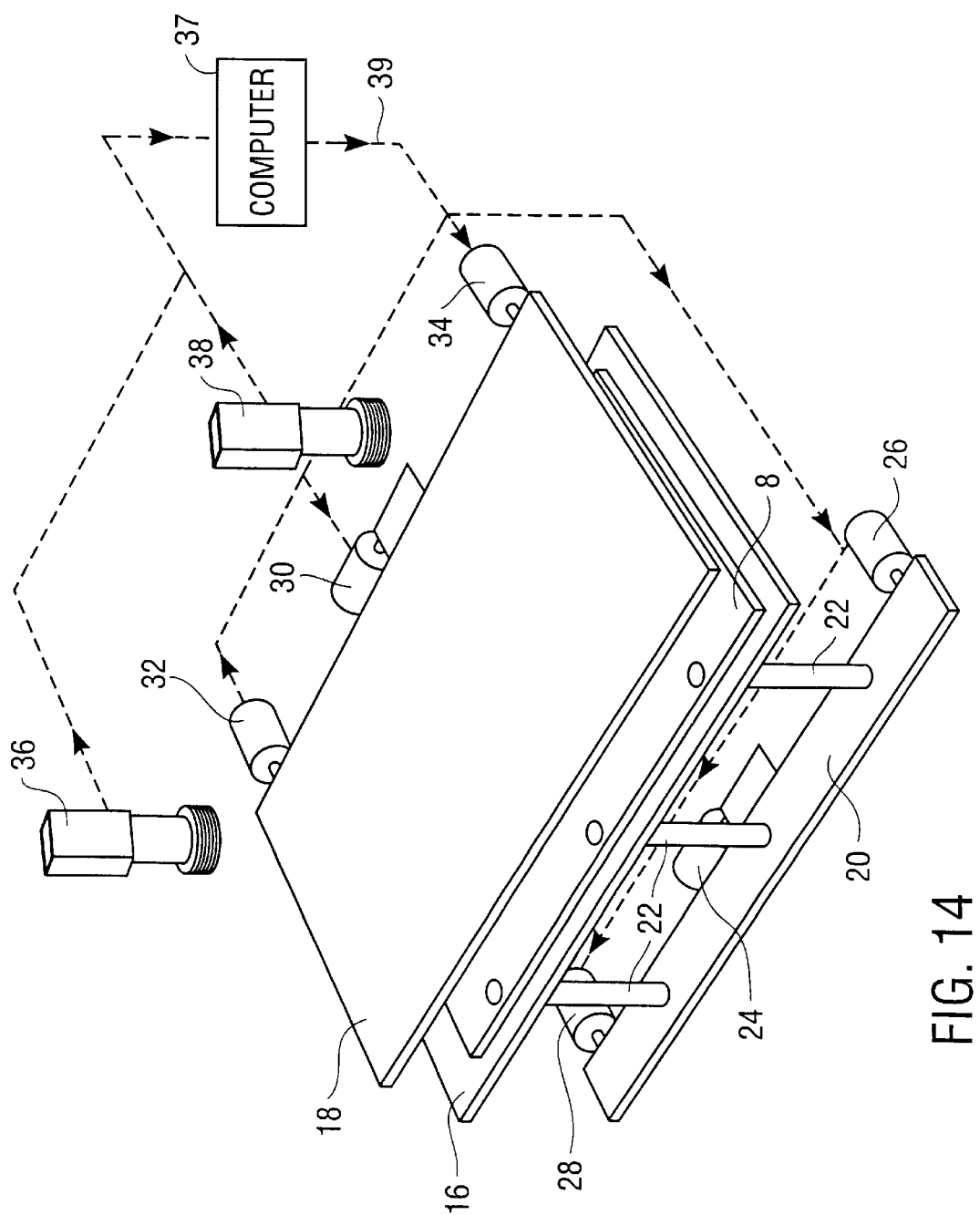
FIG. 14 is a pictorial illustration of master film and circuit board registration apparatus according to one embodiment of the present invention.

Referring now to FIG. 14, there is shown a pictorial illustration of alignment apparatus according to the present invention, for example, for aligning upper and lower sheets or layers of master circuit images with respect to an intermediate layer or circuit board panel 8. For simplicity and clearer illustration, a panel 8 is shown interposed between a fixed lower layer or sheet 16, for example, containing photographic master circuit images and an upper layer or sheet 18 containing complementary or otherwise spatially-correlated master circuit images. The circuit board panel 8 may be a conventional laminated copper-clad composite panel on fiberglass-impregnated epoxy-based central core stock. The upper and lower surfaces of the panel 8 may be coated in conventional manner with suitable photo-resist composition (such as KPR, commercially available from Eastman Kodak Co.), or other actinically-sensitive coating composition for segregating exposed and non-exposed segments of the surfaces of the panel 8 to subsequent chemical processing and selective etching in known manner. The panel 8 is shown for simplicity attached to a panel actuator bar 20 via pins or posts 22 rigidly affixed to the actuator bar 20 and panel 8 for unified movement thereof (adequate spacing of apertures through the lower sheet 16, or suitable shaping of the pins about the periphery of the lower sheet 16 to accommodate aligning movements of the pins 22 with respect to the lower sheet are omitted from the figure for simplicity). Unified movements of the bar 20, pins 22 and panel 8 along the X-axis may be achieved using X-axis translator 24. Unified movements of the bar 20, pins 22 and panel 8 along the orthogonal Y axis may be achieved by synchronized movements of the Y-axis translators 26, 28. Differential movements of these Y-axis translators 26, 28 provide skew correction of the panel 8 relative to the orthogonal X- and Y-axes of the fixed-position lower sheet 16.

Figure 13:
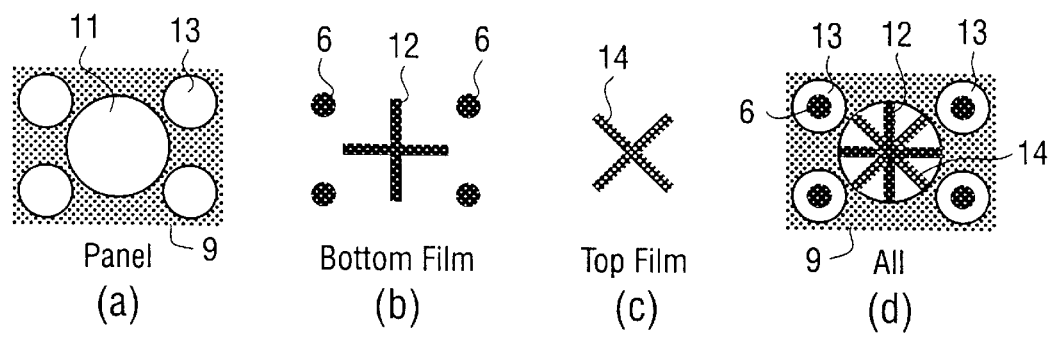
FIGS. 13a–d are plan views of registration holes 7 and patterns 6, 12, 14 in circuit board panels and master-image films for alignment according to the present invention.

Similarly, the upper sheet 18, for example of corresponding master circuit images, for alignment with the master circuit images on the lower master sheet 16 may be positioned relative to the panel 8 and to the lower sheet 16 along the X-axis by movement of the X-axis translator 30. Synchronized movements of the Y-axis translators 32, 34 move the upper sheet 18 along the Y-axis, and differential movements of the Y-axis translators 32, 34 provide skew correction of the upper layer 18 relative to the orthogonal X- and Y-axes of the fixed-position lower sheet 16. Of course, the relative positions of the fixed and movable lower and upper sheets, respectively, may be transposed where appropriate. The X-axis and Y-axis translators 24, 26, 28, 30, 32, 34 may each include digital steppers, or rotational steppers and lead screws, or the like, for providing controlled increments and decrements of movement under control of computer 37. And, the X-axis and Y-axis orientations of single and multiple translators as described herein may, of course, be transposed where appropriate, although the axis along which the greatest spacing of fields of view 9 occurs is preferred as the axis for translational positioning 24, 30. The inspection cameras 36, 38 may be conventional Change-coupled-Digitizing (CCD) cameras positioned at remote ends of the assembly of sheets 16, 18 and panel 8, with fields of view 9 including a target on the lower sheet 16, a target on the upper sheet 18, and a hole or holes through the panel 8, as shown in FIGS. 13(*d*), 15(*a*)(*b*), 19(*b*), (*c*), (*d*), 21, and 22. The image of crosses, X's, other skewed lines, dots, circles, and the like, are within the stored library of images recognizable by the computer 37 for suitable processing thereof in conventional manner to produce control signals on output conductors 39 for controlling the requisite movements of the X- and Y-axis translators to align the holes in panel 8 and the targets on upper sheet 18 with the targets on the fixed lower sheet 16. Relative vertical movements of upper and lower sheets 16, 18 and panel 8 may be accomplished (not shown) after requisite X-axis and Y-axis relative movements are completed, in order to achieve substantially parallax-free surface contact of master images with the surfaces of the panel 8 during exposure of the assembly to substantially collimated light on opposite sides of the panel 8.

Figure 15:
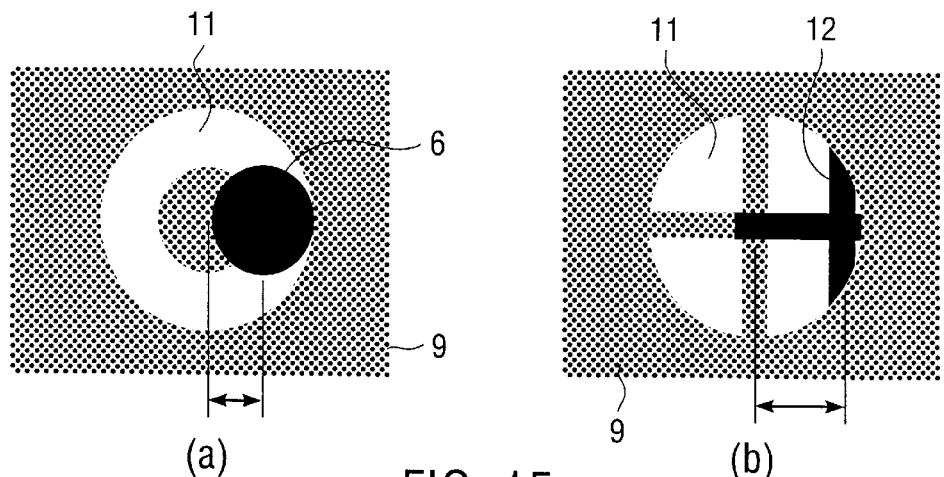
FIG. 15A is a plan view illustrating positional error and capture range of a conventional target spot 6 aligned within the perimeter of a registration hole 7.
FIG. 15B is a plan view illustrating positional error and capture range of a line target pattern 12 aligned within the perimeter of a registration hole 7.

As referenced above, the range of misalignment of circuit board panel 8 and master-image sheets or films 16, 18 over which the present invention may search and 'capture' the viewed target patterns for automated alignment is enhanced by including a larger central hole 11 within the field of view 9 of an inspection camera 36, 38 without significant loss of alignment accuracy. Specifically, the maximum range of initial misalignment between such sheets and panels that nevertheless can be identified for automated alignment correction is related to the size of the central hole 11 on the panel 8 and target patterns 6, 12 on master films 16, 18. As illustrated in FIG. 15(*a*), a target spot 6 of significant area on the master film 16 relative to the diameter of the hole 11 in the circuit board panel 8, may provide limited dynamic search and capture range within the confines of the difference of radii, as shown. A smaller spot target may expand the dynamic search and capture range, but may affect registration accuracy and sensitivity to defects in the inspection image because of fewer pixels and, hence, smaller number of registration data samples associated with the smaller dot size.

With reference to FIG. 15(b), there is shown a plan view of a registration hole 11 in a circuit board 8 initially misaligned with a cross-line target 12 of narrow line geometry that is still discernible as a cross-line target and recognizable against known pattern geometry despite major misalignment and partial masking by the registration hole. In addition, the long perimeter of the cross-line target 12 formed of significant number of pixels, thus provides substantial sample data regarding positional information of the master-image film for reduced sensitivity to flaws in the target image.

Figures 16, 17, 18:
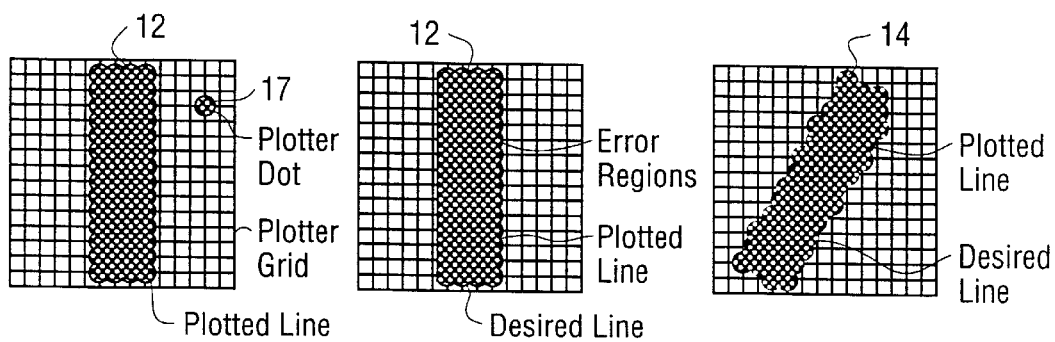
FIGS. 16, 17, and 18 are pictorial illustrations of rasters used by a plotter to produce images of target lines 12, 14 as plotted and produced on master-image films.
Figure 19:
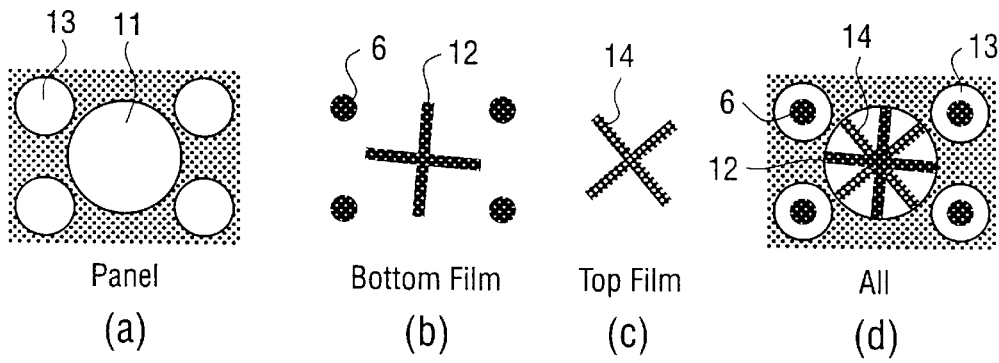
FIGS. 19a–d are plan views of registration holes 7 and patterns 6, 12, 14 in circuit board panels and master-image films for alignment according to another embodiment of the present invention.

Referring now to FIGS. 16–18, there are shown pictorial illustrations of target lines that are plotted and produced on master-image films. A computer-controlled plotter may be used to plot overlapping dots 17 in relation to a grid pattern or plotting raster of contiguous picture elements, or pixels, in association with computer-controlled automated plotting of the desired circuit images on the sheets 16, 18 of master circuit images. To assure no gaps between dots, the dots may be plotted with area approximately 40% larger than the area of pixels assembled within an output grid or scanning raster of the CCD inspection cameras 36, 38. Scaling factors may be used to correlate the output of an inspection camera with the known stored image which, along with film processing and optical distortions, may slightly displace the location of the actual line (shown dotted) from the desired line location (shown plotted), as illustrated in FIG. 17. In high accuracy applications, the target lines (shown dotted) may be deliberately slanted, as illustrated in FIG. 18, to ensure that the average positions of line edges are not subject to plotter errors. The image detection and image processing routines may average the side edges of a line in orthogonal or skewed orientation to determine the actual center, despite the width of the line and any slight plotter errors. The cross-line target patterns sensed by inspection cameras 36, 38, as illustrated in FIGS. 13a–d, may thus be configured and slanted as shown in FIGS. 19a–d for high accuracy alignment applications.

Figure 20:
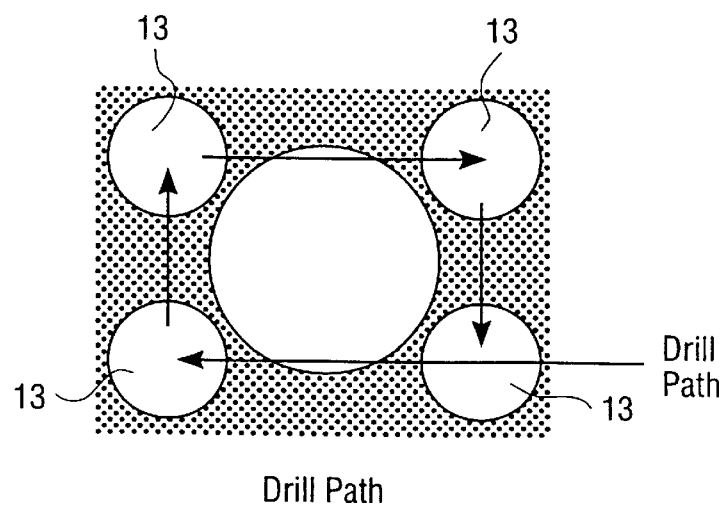
FIG. 20 is a plan view illustrating the orientation of axes along which a sequence of drill holes 7 is formed in a circuit board panel.

One purpose of accumulating a larger sampling of positional data on mechanically-formed holes in circuit board panel 8 is to gain an understanding of the range of variations of locations that a drilled hole may occupy, and to position the circuit board 8 in as close relation to the center of this range as possible. In order to determine the range of variations of hole location produced by a drilling machine, the holes may be produced along specific drill paths that promote approaching drill locations along each major axis, as illustrated in FIG. 20. Such activity thus exercises mechanical backlash and servo control settings, and provides statistical data from resulting outputs of a CCD inspection camera from which such backlash and servo settings can be identified, quantified and calibrated out of subsequent drilling locations. Thus, positional inaccuracies attributable to such mechanical anomalies as backlash and servo control setting can be significantly reduced along 4 or more vector directions where, for example, the smaller perimeter holes 13 are drilled at locations approached along four major axes, as illustrated in FIG. 20.

Figures 21, 22:
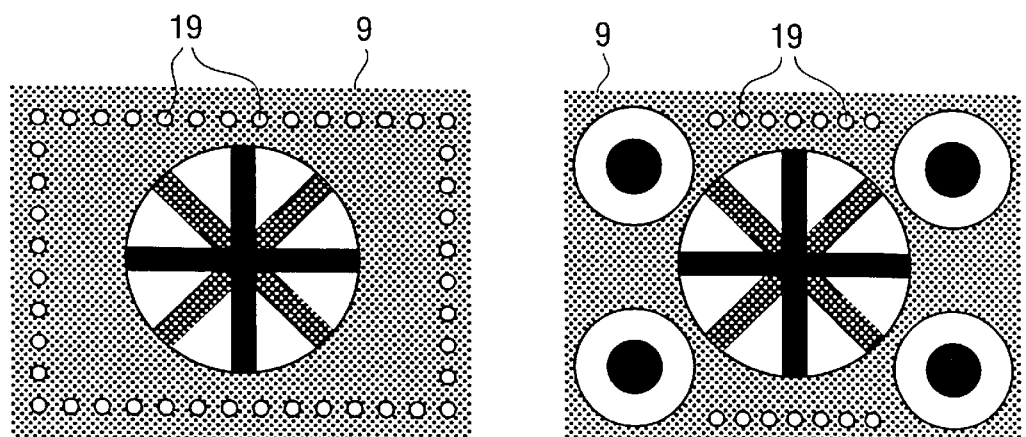
FIG. 21 is a plan view of an alternative pattern of registration holes and targets on master-image films according to another embodiment of the present invention.
FIG. 22 is a plan view of another pattern of registration holes and targets on master-image films according to still another embodiment of the present invention.

Referring now to FIGS. 21 and 22, additional smallest via holes 19 are included within the field of view 9 of a CCD inspection camera to provide additional positional sample information about the range of variation of hole locations, as well as providing data about the performance of the drilling machine and drill characteristics, such as drill wander. Such additional statistical data may thus be used for positioning the circuit board panel 8 more accurately, and for quality control of processing operations, and for identifying drilling machine or spindle errors or servo control settings, and for determining the number of circuit board panels 8 that can be drilled simultaneously while retaining deviations of holes so drilled within operational tolerances for proper later alignment activities, as described above.

Figure 23:
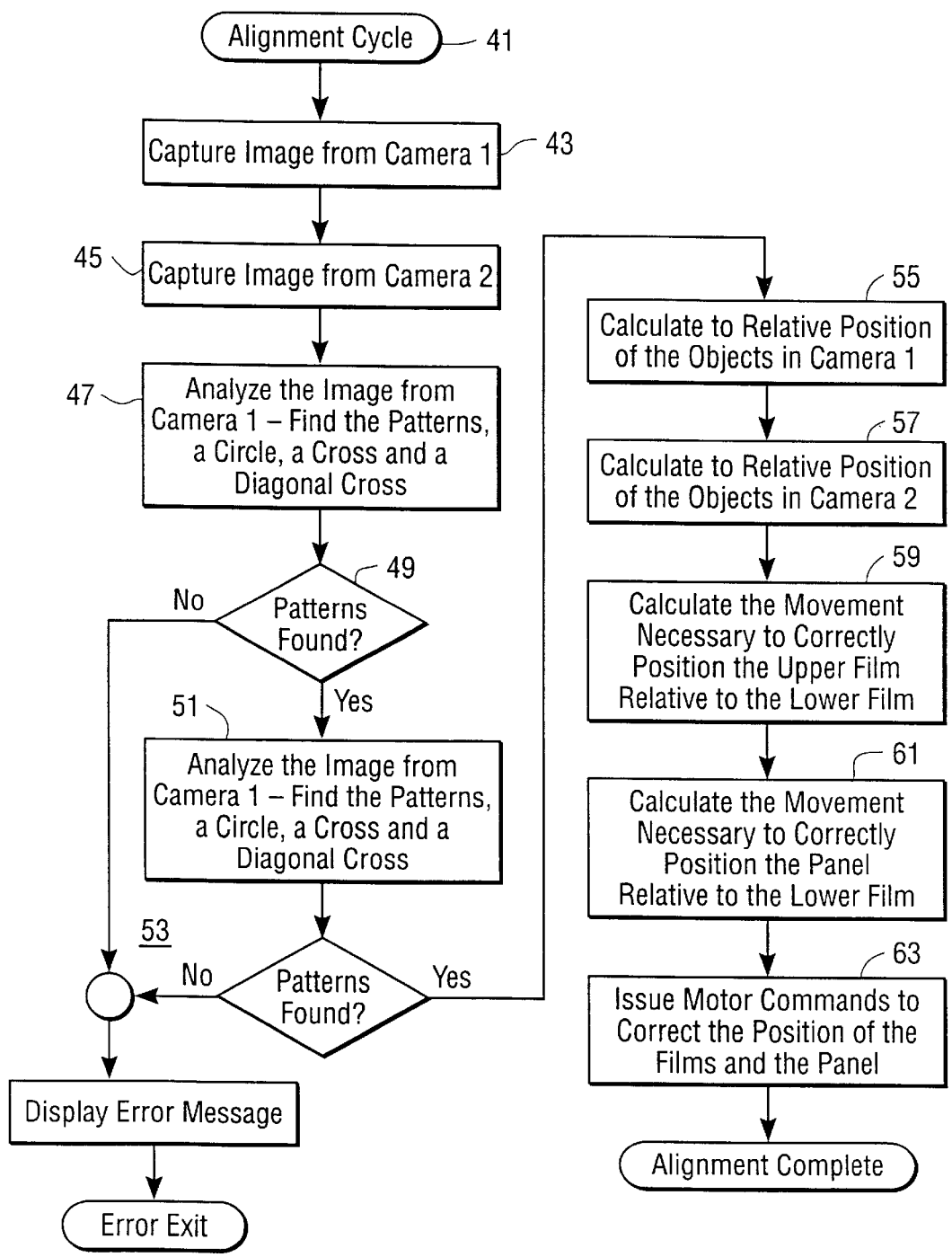
FIG. 23 is a flow chart illustrating an operating routine for aligning master pattern and reproduction sheets prior to exposure.

In operation, the relative alignments of upper and lower master image sheets 16, 18 with distinguishable target images therein, and an intermediate panel 8 with drill holes therethrough, may be accomplished according to one process embodiment of the present invention as illustrated in the flow chart of FIG. 23. At the beginning 41 of an alignment cycle, the digitized output images of the inspection cameras 36, 38 disposed at opposite ends of the assembly (for example, as illustrated in FIG. 14) are captured 43, 45 by computer 37, typically as raster data signals indicative of a bit map. The images sensed by a camera within its field of view are recognizable as images within a library of stored patterns in computer 37 which thus analyses 47 the bitmap camera image for circles, crosses, dots, X's, or the like as are plotted on the master image sheets 16, 18 and as are formed by drilled holes through the intermediate panel 8. Once the detected images are recognized 49 by the bitmap patterns presented by one camera, say camera 36, then similar image analysis 51 is performed on the bitmap image captured from the output of the other camera 38. In each analysis, if the crosses, X's, and the like, cannot be recognized within the captured image data from either camera 36, 38, then an error routine 53 displays an error message 55.

The image data associated with the recognized images detected in the data from each camera 36, 38 is processed to calculate 55 the relative positions of the master image sheets 16, 18 and panel 8 in order to determine the relative positions thereof as detected at one camera. Similarly, the relative positions of the master image sheets 16, 18 and panel 8 are calculated 57 in order to determine the relative positions thereof as detected at the other camera. Then, the correctional movements are determined 59 for properly positioning the upper sheet 18 relative to the lower master image sheet 16, and similarly the correctional movements are determined 61 for properly positioning the panel 8 relative to the lower master image sheet 16. The associated commands such as pulse counts for digital steppers are then supplied 63 by the computer 37 to each of the translators 24, 26 28, 30, 32, 34 for properly positioning the upper sheet 18 and panel 8 relative to the lower sheet 16 along X-axis and Y-axis and skew orientations. One or more iterations of this sequence may be utilized to finely resolve the positioning accuracy of the sheets 16, 18 and panel 8 to within ±1 translation-controlling output pulse from computer 37 for each of the translators 24, 26, 28, 30, 32, 34.

Figure 24:
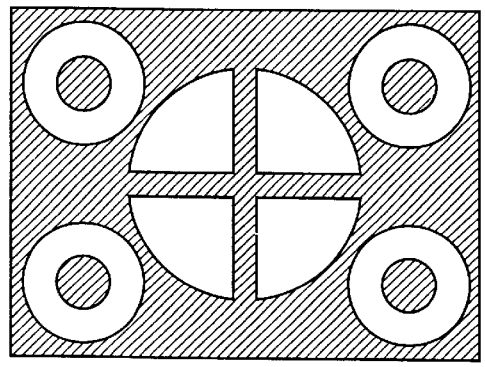
FIG. 24 is a plan view of a target pattern within a field of view of an inspection camera.
Figure 25:
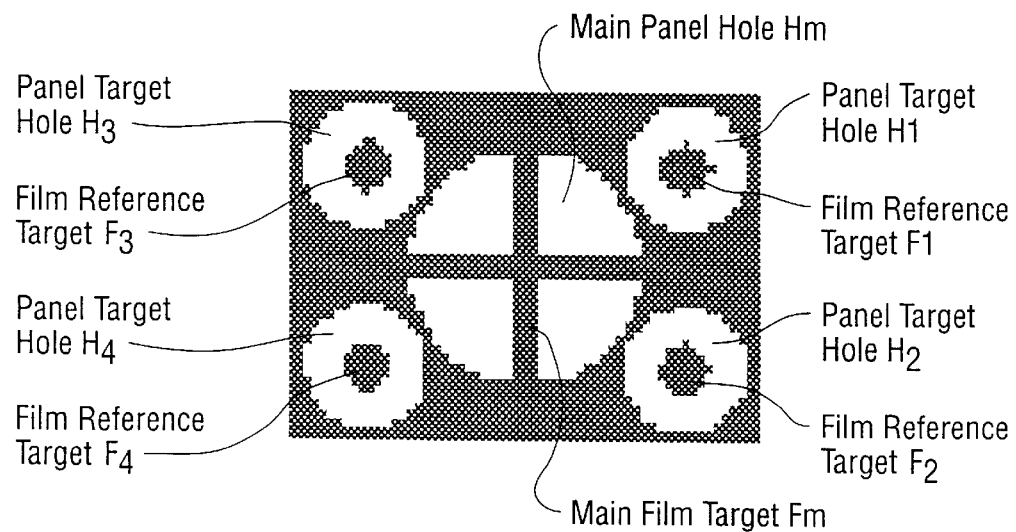
FIG. 25 is a pictorial illustration of exaggerated pixel data produced by an inspection camera on the image illustrated in FIG. 24.

The relative positions of each of the target images detected within the field of view of each camera 36, 38 as illustrated in FIGS. 24 and 25, may be calculated in accordance with one embodiment of the process of the present invention. The benefit of statistical alignment using multiple data samples can be realized from enhancements to a conventional alignment method. One specific film and hole target is illustrated in FIG. 24 and includes the cross and dots on the master film and five drilled holes through the panel to be aligned with the film. FIG. 25 illustrates the same image as viewed by the camera to produce resultant bit map pixel data, as shown, with the pixels in this illustration enlarged to demonstrate the process. Scaling of the intensity of the camera image output data is done to best distinguish the important features.

The image is captured as an array of intensity values. Modules of target images stored in computer 37 facilitate finding specific shapes by comparison or weighted averages with arrays in memory. Through interpolation, the relative position of a shape can be represented within a fraction of a pixel.

In accordance with the embodiment of the method of the present invention, the calculations entail the use of a principal hole "H" and film target "F". In addition, there are "N" additional holes and film targets that will be analyzed to derive a statistically significant correction for the position of hole "H". This calculated position will be used to drive the position translators to position the panel relative to the film. For the purpose of this example there are four additional holes and film target sets "n=1,2,3,4".

As a result of the image analysis on a simulated captured image like FIG. 25, the X and Y pixel location of each hole and each film target is obtained. In this case, image processing subroutines are employed to search for and identify specific shapes in areas of the image. The relative location of the main hole relative to the film is calculated with the following formula:

$$(\Delta X_m, \Delta Y_m) = [(X_{HM} - X_{FM}), (Y_{HM} - Y_{FM})]$$

Each of the additional sampling holes are calculated using the following formula:

$$(\Delta X_i, \Delta Y_i) = [(X_{Hi} - X_{Fi}), (Y_{Hi} - Y_{Fi})]$$

The average 'virtual' position of the panel holes is calculated using the following formula:

$$(\Delta X_v, \Delta Y_v) = \frac{[\Delta X_m, \Delta Y_m] + \sum_{i=n}^{N} (\Delta X_i, \Delta Y_i)}{N+1}$$

The calculated virtual position of the main hole is used to position the panel relative to the lower master image. Similar image processing and calculations can be performed on distinctive target images associated with the upper master image to control the positioning thereof relative to the lower master image and holes in the panel.

Therefore, the statistical registration target system of the present invention provides substantial additional control of the registration process. Although conventional alignment systems suffer from tooling hole tolerances that can be ten times greater than the accuracy tolerance of the registration measurement and the desired positioning, the registration system and the method of the present invention increase production yield and increase the production capability to conveniently accommodate greater circuit density. The present invention thus provides information about the alignment process and about the magnitude of mechanical drill errors.

This helps to identify the sources of variations and to determine the production capability. The multiple samples of registration data may also serve as a quality control mechanism that will automatically perform 100% verification of drill-hole positions in printed circuit board production.

I claim:

1. Positioning apparatus for selectively orienting one layer having at least two spaced-apart viewing areas and a plurality of apertures therethrough within each viewing area, relative to upper and lower layers each having distinguishable inspection targets thereon for viewing relative to an aperture in each of the viewing areas in the one layer, the apparatus comprising:

sensors optically aligned with each viewing area to include the plurality of apertures through such one layer positioned with respect to the sensors for producing output signals indicative of images sensed relative to each of the plurality of apertures within each of the viewing areas;

position translators for attachment to at least a pair of layers in the set of such one layer and the upper and lower layers and responsive to positioning signals applied thereto for selectively positioning such pair of layers with respect to orthogonal axes and relative to the remaining one of the set of layers; and a processor coupled to receive the output signal from the sensors for detecting within the images represented thereby the selected inspection targets on the upper and lower layers and the plurality of apertures through such one layer in each of the viewing areas thereon for determining the relative positioning thereof to supply positioning signals to each of the position translators for selectively relatively positioning the pair of layers and the remaining one of the set of layers with inspection targets and apertures substantially aligned.

2. Positioning apparatus as in claim 1 in which such one layer has a plurality of apertures therethrough with probable positional errors within each of the spaced-apart viewing areas for substantial alignment of the inspection targets and plural apertures within each viewing area.

3. Positioning apparatus as in claim 2 in which the viewing areas each with a plurality of apertures through the one layer are oriented substantially along an axis on the one layer; and a position translator is disposed for attachment to such one layer to position said one layer substantially only along a direction substantially aligned with said axis.

4. A method for selectively positioning one layer having at least two spaced-apart viewing areas each including a plurality of apertures therethrough with respect to a reference layer having distinguishable target images thereon for optical inspection relative to the apertures, the method comprising the steps of:

optically sensing a plurality of target images of the reference layer and a plurality of apertures through the one layer appearing within one viewing area at one location on the one layer to produce representative image signals;

optically sensing a plurality of target images of the reference layer and a plurality of apertures through the one layer appearing within another viewing area at another location spaced along an axis from the one location to produce representative image signals;

analyzing the image signals to selectively distinguish the plurality of target images of the reference layer and the plurality of apertures through the one layer in each of the viewing areas for determining the relative positions of the reference layer and the one layer within each of the viewing areas;

determining the relative positional movements required to substantially align the plurality of target images and the plurality of apertures within each of the viewing areas; and selectively relatively moving the one layer and reference layer for substantially aligning the positions of the plurality of target images and plurality of apertures within each of the viewing areas.

5. The method of claim 4 in which the one layer is selectively moved relative to the reference layer.

6. A method for selectively positioning one layer having at least two spaced-apart viewing areas each including a plurality of apertures therethrough with respect to upper and lower layers each having a plurality of distinguishable target images thereon for optical inspection relative to the apertures, the method comprising the steps of:

optically sensing a plurality of target images on at least one of the upper and lower layers and each of the plurality of apertures through the one layer appearing within one viewing area at one location to produce representative image signals;

optically sensing a target image on the other of upper and lower layers and each of the plurality of apertures through the one layer appearing within another viewing area at another location spaced along an axis from the one location to produce representative image signals;

analyzing the image signals to selectively distinguish the plurality of target images on the upper and lower layers and the plurality of apertures through the one layer at each of the viewing areas for determining the relative positions of the upper and lower and one layers within each of the viewing areas;

determining the relative positional movements required to substantially align the plurality of target images and plurality of apertures within each of the viewing areas; and selectively relatively moving at least a pair of layers in the set of the one layer and the upper and lower layers relative to the remaining one of the set of layers for substantially aligning the positions of the plurality of target images and plurality of apertures within each of the viewing areas.

7. The method according to claim 6 in which the one layer and one of the upper and lower layers are selectively relatively moved with respect to the other of the upper and lower layers for substantially aligning the positions of each of the target images sensed in relation to a corresponding aperture in the plurality of apertures in each of the viewing areas.

* * * * *